United States Patent [19]
Rahman et al.

[11] Patent Number: 5,543,263
[45] Date of Patent: Aug. 6, 1996

[54] PHOTORESIST HAVING A LOW LEVEL OF METAL IONS

[75] Inventors: M. Dalil Rahman, Warwick; Dana L. Durham, East Greenwich, both of R.I.

[73] Assignee: Hoechst Celanese Corporation, Somerville, N.J.

[21] Appl. No.: 261,646

[22] Filed: Jun. 17, 1994

Related U.S. Application Data

[63] Continuation of Ser. No. 904,229, Jun. 25, 1992, abandoned, which is a continuation-in-part of Ser. No. 847,454, Mar. 6, 1992, abandoned.

[51] Int. Cl.$^6$ ............................................. G03C 5/18
[52] U.S. Cl. ...................... 430/168; 430/190; 430/191; 430/192; 430/193; 528/482
[58] Field of Search ............................ 430/168, 190–194; 528/482

[56] References Cited

U.S. PATENT DOCUMENTS

| | | | |
|---|---|---|---|
| 2,929,808 | 4/1956 | Ross et al. . | |
| 4,033,909 | 7/1977 | Papa . | |
| 4,033,910 | 7/1977 | Papa .......................... | 528/165 |
| 4,452,883 | 6/1984 | Frenchik et al. .......... | 430/502 |
| 4,567,130 | 1/1986 | Held ........................... | 430/294 |
| 4,584,261 | 4/1986 | Held ........................... | 430/294 |
| 4,636,540 | 1/1987 | Warfel ....................... | 523/310 |
| 4,747,954 | 5/1988 | Vaughn et al. . | |
| 4,784,937 | 11/1988 | Tanaka et al. . | |
| 4,833,067 | 5/1989 | Tanaka et al. . | |
| 4,914,006 | 4/1990 | Kato et al. . | |
| 5,073,622 | 12/1991 | Wojtech et al. . | |
| 5,116,715 | 5/1992 | Roland ...................... | 430/165 |
| 5,118,787 | 6/1992 | Furuno . | |
| 5,175,078 | 12/1992 | Aoyama et al. .......... | 430/331 |
| 5,286,606 | 12/1994 | Rahman et al. . | |

FOREIGN PATENT DOCUMENTS

| | | |
|---|---|---|
| 544325 | 5/1993 | European Pat. Off. . |
| 544324 | 6/1993 | European Pat. Off. . |
| 1072155 | 3/1989 | Japan . |
| 1509354 | 5/1978 | United Kingdom . |
| 93/12152 | 6/1993 | WIPO . |
| 94/01807 | 1/1994 | WIPO . |
| WO94/12912 | 6/1994 | WIPO . |
| WO94/14863 | 7/1994 | WIPO . |
| WO94/14858 | 7/1994 | WIPO . |

OTHER PUBLICATIONS

Derwent Publ. Ltd., London, GB; & JP-A-4065415 (Hitachi Chemical) Feb. 3, 1992.
Derwent Publ. Ltd., London, GB; & JP-A-1228560 (Hitachi) Dec. 9, 1989.
Amberlite Ion Exchange Resins Laboratory Guide, Rohm and Haas Company, Philadelphia, PA, USA, Sep. 1979.
Bayard; "Water Free of Heavy Metals for Medical Use and Ion Exchange Resin Used in its Preparation"; Nov. 16, 1992; CA98(26).221589z.
Hirai et al; "Treatment of Waste Waters Containing Formaldehyde and Metals with Chelating Ion Exchange Resins"; Nov. 5, 1975; CA84(14):95328j.
Kimura et al; "Purification of Formaldehyde"; Mar. 9, 1977; CA87(7):52776y.
Journal of the Electrochemical Society, vol. 137, No. 12, Dec. 1990, Manchester, New Hampshire US, pp. 393900–3905, XP0001681, T. Tanada "A New Photolithography Tech. w/Antireflective. . .".
Derwent Publ. Ltd., London, GB; & JP-A-4065415 (Hitachi Chemical) Feb. 3, 1992.
Derwent Publ. Ltd., London, GB; & JP-A-1228560 (Hitachi) Dec. 9, 1989.
Chemical Abstract, vol. 112, No. 18, Apr. 30, 1990, Columbus, OH, p. 17, the Abstract 159201u, JP-A-1190713 (Inatomi, Shigeki et al) Jul. 31, 1989.

*Primary Examiner*—Kathleen Duda
*Attorney, Agent, or Firm*—Andrew F. Sakyo, Jr.

[57] ABSTRACT

The present invention provides methods for producing photoresist compositions having a very low level of metal ions, utilizing specially treated ion exchange resins. A method is also provided for producing semiconductor devices using such photoresist compositions.

3 Claims, No Drawings

PHOTORESIST HAVING A LOW LEVEL OF METAL IONS

This is a continuation of application Ser. No. 07/904,229 filed on Jun. 25, 1992, now abandoned, which is a continuation-in-part of Ser. No. 07/847,454 filed Mar. 6, 1992, now abandoned.

BACKGROUND OF THE INVENTION

The present invention relates to a process for producing photoresists having a very low level of metal ions, especially sodium and iron, and for using such photoresists in producing semiconductor devices. The present invention also relates to a process for making photoresists having a very low level of metal ions, such as sodium and iron. Further, the present invention relates to a process for coating substrates with these photoresist compositions as well as the process of coating, imaging and developing photoresists on suitable substrates.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

Metal contamination has been a problem for a long time in the fabrication of high density integrated circuits and computer chips, often leading to increased defects, yield losses, degradation and decreased performance. In plasma processes, metals such as sodium and iron, when they are present in photoresists, can cause contamination especially during plasma stripping. However, these problems have been overcome to a substantial extent during the fabrication process. For example, by utilizing HCL gettering of the contaminants during a high temperature anneal cycle.

As semiconductor devices have become more sophisticated, these problems have become much more difficult to overcome. When silicon wafers are coated with a liquid positive photoresist and subsequently stripped off, such as with oxygen microwave plasma, the performance and stability of the semiconductor device is often seen to decrease. As the plasma stripping process is repeated, more degradation of the device frequently occurs. A primary cause of such problems has been found to be the metal contamination in the photoresist, particularly sodium and iron ions. Metal levels of less than 1.0 ppm in the photoresist have been found to adversely affect the properties of such semiconductor devices.

Novolak resins are frequently used a polymeric binder in liquid photoresist formulations. These resins are typically produced by conducting a condensation reaction between formaldehyde and one or more multi-substituted phenols, in the presence of an acid catalyst, such as oxalic acid. In producing sophisticated semiconductor devices, it has become increasingly important to provide photoresists having metal contamination levels well below 1.0 ppm.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

SUMMARY OF THE INVENTION

The present invention relates to a process for producing photoresists containing very low levels of metal ions, especially sodium and iron. The invention further relates to a process for producing semiconductor devices using such photoresists.

The process of the subject invention provides a photoresist, preferably a liquid photoresist, having a very low level of metal ions. The liquid photoresists may be either negative or positive working, although positive photoresists are preferred.

The photoresists obtained have very low levels of metal ions such as iron, sodium, potassium, calcium, magnesium, copper and zinc. The total metal ion level is preferably less than 500, more preferably less than 200 ppb. Sodium and iron are the most common metal ion contaminants and among the easiest to detect. The level of these metal ions serves as an indicator of the level of other metal ions. The level of sodium and iron ions, are each less than 200 ppb, preferably less than 100 ppb, more preferably less than 50 ppb, even more preferably less than 20 ppb and most preferably less than 10 ppb.

DETAILED DESCRIPTION OF THE PREFERRED EMBODIMENT

The present invention provides a process for producing photoresist having a very low level of metal ions, particularly sodium and iron. In the preferred embodiment, the process utilizes a specialty treated acidic ion exchange resin to purify the photoresist. The subject process comprises:

a) washing an acidic ion exchange resin with water, preferably deionized water, followed by a mineral acid solution (e.g. a 5–98% solution of sulfuric, nitric or hydrochloric acid) to reduce the level of total sodium and iron ions in the ion exchange resin to less than 500 ppb, preferably less than 200 ppb, more preferably less than 100 ppb and most preferably no more than 40 ppb;

b) formulating a photoresist composition solution by providing an admixture of: 1) a photosensitive component in an amount sufficient to photosensitize the photoresist composition, 2) a film forming resin and 3) a suitable solvent;

c) passing the photoresist composition solution through the ion exchange resin and reducing the level of sodium and iron ions in the solution to less than 200 ppb each, preferably less than 100 ppb, more preferably less than 50 ppb, even more preferably less than 20 ppb and most preferably less than 10 ppb.

The invention further provides a method for producing a semiconductor device by producing a photo-image on a substrate by coating a suitable substrate with a photoresist composition solution by:

a) washing an acidic ion exchange resin with water, preferably deionized water, followed by a mineral acid solution (e.g. sulfuric, nitric or hydrochloric acid) to reduce the level of total sodium and iron ions in the ion exchange resin to less than 500 ppb, preferably less than 200 ppb, more preferably less than 100 ppb and most preferably no more than 40 ppb;

b) treating the acidic ion exchange resin with a solvent which is the same as or compatible with the photoresist solvent; preferably the resin is treated with sufficient amount of a solvent which is the same as, or at least compatible with, the photoresist composition solvent to remove a majority of the water, most preferably substantially all of the water is removed;

c) formulating a photoresist composition solution by providing an admixture of:
1) a photosensitive component in an amount sufficient to photosensitize the photoresist composition,
2) a suitable film forming resin and
3) a suitable solvent;

d) passing the photoresist composition through the ion exchange resin and reducing the sodium and iron ion level to less than 200 ppb each, preferably less than 100 ppb, more preferably less than 50 ppb, even more preferably less than 20 ppb and most preferably less than 10 ppb;

e) coating a suitable substrate with the photoresist composition solution;

f) heat treating the coated substrate until substantially all of the solvent is removed; image-wise exposing the photosensitive composition and removing the image-wise exposed areas of such composition with a suitable developer, such as an aqueous alkaline developer. Optionally one may perform a baking of the substrate either immediately before or after the removing step.

An acidic ion exchange resin, such as a styrene/divinylbenzene cation exchange resin, is utilized in the present process. Such ion exchange resins are available from Rohm and Haas Company, e.g. AMBERLYST 15 resin. These resins typically contain as much as 80,000 to 200,000 ppb of sodium and iron. Before being utilized in the process of the invention, the ion exchange resin must be treated with water and then a mineral acid solution to reduce the metal ion level. Preferably the ion exchange resin is initially rinsed with deionized water, followed by a mineral acid solution, such as a 10 percent sulfuric acid solution, rinsed again with deionized water, treated again with the mineral acid solution and once more rinsed with deionized water. Before purifying the photoresist composition solution, it is critical that the ion exchange resin is first rinsed with a solvent which is the same as, or at least compatible with, the photoresist composition solvent.

If the photoresist composition solution contains one or more components which will react chemically with the acidic ion exchange resin, the photoresist composition should be initially formulated without such components. This will provide a photoresist composition substantially free of any component which will react with the acidic ion exchange resin. After purification, such components are added to the photoresist composition solution.

The photoresist composition solution is preferably passed through a column containing the ion exchange resin, e.g. a solution of from about 10 to 40 weight percent in a suitable solvent. Such solutions typically contain from 500 to 20,000 ppb each of sodium and iron ions. During the process of the present invention, these levels are each reduced to as low as 10 ppb each.

The present invention provides a process for producing a photoresist composition solution and a process for producing semiconductor devices using such photoresist composition solution. The photoresist composition solution is formed by providing an admixture of a photosensitizer, a film forming resin and a suitable solvent.

Suitable film forming resins include novolak resins, such as a substituted naphthoquinone diazide, trihydroxyphenyl ethane resins or hydroxystyrene polymers, such as poly(p-hydroxystyrene), or tertiary-butoxycarbonyl derivatives of such novolak resins or hydroxystyrene polymers.

Suitable solvents for such photoresists may include propylene glycol mono-alkyl ether, propylene glycol alkyl (e.g. methyl) ether acetate, ethyl-3-ethoxypropionate, ethyl lactate, mixtures of ethyl-3-ethoxypropionate and ethyl lactate, butyl acetate, xylene, diglyme, ethylene glycol monoethyl ether acetate. The preferred solvents are propylene glycol methyl ether acetate (PGMEA) and ethyl-3-ethoxypropionate (EEP).

Other optional ingredients such as colorants, dyes, antistriation agents, leveling agents, plasticizers, adhesion promoters, speed enhancers, solvents and such surfactants as non-ionic surfactants may be added to the solution of novolak resin, sensitizer and solvent before the photoresist composition is coated onto a substrate. Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of film forming resin and sensitizer. Plasticizers which may be used include, for example, phosphoric acid tri-(beta-chloroethyl)-ester; stearic acid; dicamphor; polypropylene; acetal resins; phenoxy resins; and alkyl resins, at about one to ten percent weight levels, based on the combined weight of film forming resin and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)ethyltrimethoxysilane; p-methyl-disilane-methyl methacrylate; vinyltrichlorosilane; and gamma-aminopropyl triethoxysilane up to about a 4 percent weight level, based on the combined weight of film forming resin and sensitizer. Development speed enhancers that may be used include, for example, picric acid, nicotinic acid or nitrocinnamic acid up to about a 20 percent weight level, based on the combined weight of film forming resin and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to about 10% weight levels, based on the combined weight of film forming resin and sensitizer.

The prepared photoresist composition solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

Formulation of Photoresist Composition

Into 73.88 grams of PGMEA, 19.58 grams of a m-cresol; 3,5-xylenol; formaldehyde novolak resin (the cresol mixture was 3 parts m-cresol and 1 part 3,5-xylenol; the mole ratio of the cresol mixture to formaldehyde was 1.0/0.7) was added. A mixture of photosensitizers was added as follows: 3.26 grams of the 2,1,5-diazonaphthoquinone sulfonic acid 40 to 80% ester of 2,3,4,4'-tetrahydroxybenzophenone, 2.61 grams of the 2,1,5-diazonaphthoquinone sulfonic acid 40–80% ester of 2,3,4-trihydroxybenzophenol and 0,651 grams of the 2,1,5-diazonaphthoquione sulfonic acid (82–91%) ester of 2,3,4-trihydroxy benzophenone and 0.020 grams of FC-430 surfactant (fluoroaliphatic polymeric ester) were dissolved and filtered through a membrane filter (0.2 μm in pore size).

EXAMPLE 2

Wet AMBERLYST 15 ion exchange resin beads were placed in a conical flask and deionized water was added so that all of the resin beads were under water. The flask was sealed and allowed to stand overnight to swell the resin beads. The next morning the water was decanted, deionized water added to cover the resin beads and the flask was shaken slowly. The water was again decanted. The rinsing with deionized water and decanting steps were repeated three more times. The resulting slurry of ion exchange resin was poured into a glass column equipped with a porous disk and a stopcock. The resin was allowed to settle to the bottom and the column was back flushed with deionized water for 25 minutes. The resin was again allowed to settle to the bottom.

The bed volume was calculated as 45 ml. A 10 percent sulfuric acid solution was passed down through the resin bed at a rate of about 16 ml./min (14.1 bed volumes/hour). 6 bed volumes of the acid solution were passed through the resin bed. 60 bed volumes of deionized water were then passed down through the resin bed at about the same flow rate. The pH of the effluent water was measured to assure that it matched the pH of 6 for fresh deionized water. One bed volume of diglyme was passed through the column to remove water, followed by one bed volume of PGMEA to saturate the column with the same solvent as the photoresist solvent.

342 grams of the photoresist solution of Example 1, containing about 400 ppb of sodium and about 800 ppb of iron, was passed down through the resin bed at the same flow rate. The cleaned photoresist obtained had a very low level of metal ions as follows: sodium—<10 ppb; iron—<10 ppb.

EXAMPLE 3

The untreated photoresist of Example 1 was compared with the treated photoresist of Example 2 for: photospeed, contrast, dark film loss, thermal stability and aging. For the photoresist of Example 2 the results, when compared to the photoresist of Example 1 were as follows: photospeed—+1.2%; contrast—3% lower; dark film loss—4% faster; thermal stability—no difference; againg (3 days at 50° C.)—no difference.

Photospeed is calculated using the Perkin Elmer Method. It is calculated using the energy needed to remove a constant amount of film. The thickness loss versus the log of energy is linear. The percent photospeed of the sample is determined as:

$$\% \text{ difference} = \frac{\text{Energy of Sample/Energy Reference}}{\text{Energy Reference}} \times 100$$

Constrast is generated from our photospeed test. This is defined in Literature as the Negative Slope of a "Normalized Thickness Remaining" vs. "Log Energy" relationship. Internal and external data and literature show these properties are linear using our photospeed method. Contrast represents a sensitivity to changes in underexposed and overexposed regions of a film. Higher contrast indicates the lithographic process can better distinguish between these areas, thus improved performance of the lithographic patterning process.

Dark Film Loss is essentially the rate of thickness loss of Photoresist in an unexposed region. In connection with dissolution rate in the exposed region (i.e. Photospeed) and Contrast, this value illustrates the differentiation between exposed and unexposed regions, indicating patterning performance.

Thermal Stability is essentially the flow characteristics of a photoresist pattern at different baking conditions. Baking after patterning, a common practice in Lithography, requires material which has some resistance to temperature.

Aging test are run comparing viscosity, absorptivity, photospeed, etc. with and without heating photoresist samples at 50° C. for a period of time. Absorptivity here is a measure of unreacted sensitizer. This sensitizer level is effected by light, heat and reactions with other chemicals. Sensitizer level and reacted products effects many photoresist properties, including shelf life and all of the characteristics mentioned above.

EXAMPLE 4

Formulation of Photoresist Composition

Into 69.07 grams of PGMEA, 23.18 grams of a m-cresol; 3,5-xylenol; formaldehyde novolak resin (the cresol mixture was 3 parts m-cresol and 1 part 3,5-xylenol; the mole ratio of the cresol mixture to formaldehyde was 1.0/0.7) was added. A mixture of photosensitizers was added as follows: 3.86 grams of the 2,1,5-diazonaphthoquinone sulfonic acid 40 to 80% ester of 2,3,4,4'-tetrahydroxybenzophenone, 3.09 grams of the 2,1,5-diazonaphthoquinone sulfonic acid 40–80% ester of 2,3,4-trihydroxybenzophenol and 0.771 grams of the 2,1,5-diazonaphthoquione sulfonic acid (82–91%) ester of 2,3,4-trihydroxy benzophenone and 0.024 grams of FC-430 surfactant (fluoroaliphatic polymeric ester) were dissolved and filtered through a membrane filter (0.2 μm in pore size).

EXAMPLE 5

Wet AMBERLYST 15 ion exchange resin beads were placed in a conical flask and deionized water was added so that all of the resin beads were under water. The flask was sealed and allowed to stand overnight to swell the resin beads. The next morning the water was decanted, deionized water added to cover the resin beads and the flask was shaken slowly. The water was again decanted. The rinsing with deionized water and decanting steps were repeated three more times. The resulting slurry of ion exchange resin was poured into a glass column equipped with a porous disk and a stopcock. The resin was allowed to settle to the bottom and the column was back flushed with deionized water for 25 minutes. The resin was again allowed to settle to the bottom.

The bed volume was calculated as 45 ml. A 10 percent sulfuric acid solution was passed down through the resin bed at a rate of about 16 ml./min (14.1 bed volumes/hour). 6 bed volumes of the acid solution were passed through the resin bed. 60 bed volumes of deionized water were then passed down through the resin bed at about the same flow rate. The pH of the effluent water was measured to assure that it matched the pH of 6 for fresh deionized water.

342 grams of the photoresist solution of Example 4, containing about 400 ppb of sodium and about 800 ppb of iron, was passed down through the resin bed at the same flow rate. The cleaned photoresist obtained had a very low level of metal ions as follows: sodium—<10 ppb; iron—<10 ppb.

We claim:

1. A method for producing a photoresist having a very low level of metal ions comprising:

a) washing an acidic exchange resin with water, washing said ion exchange resin with a mineral acid solution and thereby reducing the level of sodium and iron ions in the ion exchange resin to less than 100 ppb each;

b) formulating a photoresist composition solution by providing an admixture of: 1) a photosensitive component in an amount sufficient to photosensitize the photoresist composition, 2) a film forming resin and 3) a suitable photoresist solvent;

c) treating the acidic ion exchange resin with a solvent which is the same as or compatible with the photoresist solvent to remove substantially all of the water;

d) passing the photoresist composition solution through said ion exchange resin and thereby reducing the sodium and iron ion level of said solution to less than 20 ppb each.

2. The method of claim 1 wherein the level of sodium and iron ions in the ion exchange resin is reduced to no more than 40 ppb each.

3. The method of claim 1 wherein the sodium and iron ion level in the photoresist composition is reduced to less than 10 ppb each.

* * * * *